US009781849B2

(12) United States Patent
Negishi et al.

(10) Patent No.: US 9,781,849 B2
(45) Date of Patent: Oct. 3, 2017

(54) ELECTRONIC CONTROL DEVICE

(71) Applicant: Hitachi Automotive Systems, Ltd., Hitachinaka-shi, Ibaraki (JP)

(72) Inventors: Yoshiyasu Negishi, Hitachinaka (JP); Hitoshi Furudate, Hitachinaka (JP); Takayuki Fukuzawa, Ishioka (JP); Kentaro Yamanaka, Ota (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/424,675

(22) PCT Filed: Sep. 12, 2013

(86) PCT No.: PCT/JP2013/074679
§ 371 (c)(1),
(2) Date: Feb. 27, 2015

(87) PCT Pub. No.: WO2014/050591
PCT Pub. Date: Apr. 3, 2014

(65) Prior Publication Data

US 2015/0208525 A1 Jul. 23, 2015

(30) Foreign Application Priority Data

Sep. 28, 2012 (JP) ................................ 2012-215343

(51) Int. Cl.
*H05K 5/00* (2006.01)
*H05K 5/02* (2006.01)
(Continued)

(52) U.S. Cl.
CPC ....... *H05K 5/0056* (2013.01); *B60R 16/0239* (2013.01); *H05K 5/02* (2013.01);
(Continued)

(58) Field of Classification Search
CPC ...... H05K 5/0056; H05K 5/02; H05K 5/0204; H05K 5/0213; H05K 5/068; H05K 5/0047; B60R 16/0239
(Continued)

(56) References Cited

U.S. PATENT DOCUMENTS

2007/0134981 A1* 6/2007 Shinoda ............... H05K 5/0047 439/587
2008/0196918 A1* 8/2008 Zadach ................ H05K 5/0213 174/50.5
(Continued)

FOREIGN PATENT DOCUMENTS

JP 1-173982 U 12/1989
JP 11-87944 A 3/1999
(Continued)

OTHER PUBLICATIONS

Japanese Office Action issued in counterpart Japanese Application No. 2012-215343 dated Mar. 1, 2016 (four (4) pages).
(Continued)

*Primary Examiner* — Adrian S Wilson
*Assistant Examiner* — Abhishek Rathod
(74) *Attorney, Agent, or Firm* — Crowell & Moring LLP

(57) ABSTRACT

An electronic control device (10) includes a housing having a plurality of housing members (1) joined together, a housing vent hole (2) formed through the housing member (1) so as to extend in a thickness direction of the housing member, a protection wall (3) covering an outer opening (2*b*) of the housing vent hole (2), with a gap (3*b*) left between the protection wall (3) and the outer opening (2*b*), a protection-wall vent hole (3*a*) formed in the protection wall (3) at a position apart from the housing vent hole (2) so as to extend from the gap (3*b*) in a radial direction of the housing vent hole (2), and an air-permeable waterproof membrane (5) fixed to an inner opening (2*a*) of the housing vent hole (2). A vent passage (6) with a bent part (6*a*) is formed between
(Continued)

the air-permeable waterproof membrane (5) and the protection-wall vent hole (3*a*).

5 Claims, 7 Drawing Sheets

(51) Int. Cl.
*B60R 16/023* (2006.01)
*H05K 5/06* (2006.01)

(52) U.S. Cl.
CPC ......... *H05K 5/0204* (2013.01); *H05K 5/0213* (2013.01); *H05K 5/0047* (2013.01); *H05K 5/068* (2013.01)

(58) Field of Classification Search
USPC ..... 361/752, 679.02, 679.56, 719, 688, 690; 174/383, 50.5; 439/76.2; 277/644, 928
See application file for complete search history.

(56) References Cited

U.S. PATENT DOCUMENTS

2008/0310131 A1* 12/2008 Fino .................. H05K 7/20454 361/758
2011/0211311 A1 9/2011 Shinoda
2011/0228498 A1* 9/2011 Kawai ................ H05K 7/20854 361/752
2013/0250521 A1* 9/2013 Kawai ................ H05K 7/20854 361/714
2013/0335919 A1 12/2013 Shinoda
2014/0318374 A1* 10/2014 Yano ....................... F21V 31/03 96/11

FOREIGN PATENT DOCUMENTS

JP 2004-266211 A 9/2004
JP 2006-5162 A 1/2006
JP 2006005162 A * 1/2006
JP 2006-196596 A 7/2006
JP 2010-278056 A 12/2010
JP 2011-181547 A 9/2011

OTHER PUBLICATIONS

International Search Report (PCT/ISA/210) dated Nov. 5, 2013, with English translation (Three (3) pages).

* cited by examiner

ELECTRONIC CONTROL DEVICE

FIELD OF THE INVENTION

The present invention relates to an electronic control device for a vehicle, in which a circuit board is accommodated in a watertight inner space of a housing.

BACKGROUND ART

An electronic control device such as engine control unit or automatic transmission control unit for a vehicle generally includes a housing having a plurality of housing members joined together to define therein a protection space (watertight space) and a circuit board accommodated in the protection space of the housing and mounting thereon various electronic components.

This type of electronic control device requires high waterproof performance for use in an engine room etc. of the vehicle. If the inner space of the housing is completely sealed, however, the housing and its sealing part may be subjected to excessive stress due to increase or decrease in the internal pressure of the housing. The application of such excessive stress becomes a cause of deterioration of durability and reliability.

It has thus been proposed to provide a so-called breathing filter by forming a vent hole in the housing member and fixing an air-permeable waterproof membrane in the vent hole (see, for example, Patent Document 1).

PRIOR ART DOCUMENTS

Patent Documents

Patent Document 1: Japanese Laid-Open Patent Publication No. 2011-181547

SUMMARY OF THE INVENTION

The present inventors have found that the above-mentioned electronic control device faces the problem that the air-permeable waterproof membrane gets damaged under the influence of e.g. high-pressure water during steam vehicle washing. Although there have been studied techniques for protecting the air-permeable waterproof membrane from damage by high-pressure water etc., these techniques are not yet satisfactory.

The present invention has been made in view of the foregoing circumstances. It is an object of the present invention to provide an electronic control device having an air-permeable waterproof membrane fixed to a housing so as to prevent the air-permeable waterproof membrane from being affected by high-pressure water etc. while ensuring both of air permeability and waterproofness inside the housing.

As a solution to the above-mentioned problem, there is provided according to one aspect of the present invention an electronic control device, comprising: a housing having a plurality of housing members joined together to define therein an inner space; and a circuit board accommodated in the inner space of the housing and mounting thereon various electronic components, a housing vent hole being formed through at least one of the housing members so as to extend in a thickness direction of the at least one of the housing members, the electronic control device further comprising: a protection wall covering an outer opening of the housing vent hole, with a gap left between the protection wall and the outer opening of the housing vent hole, a protection-wall vent hole being formed in the protection wall at a position apart from the housing vent hole so as to extend from the gap in a radial direction of the housing vent hole; and an air-permeable waterproof membrane fixed to an inner opening of the housing vent hole, whereby a vent passage between the air-permeable waterproof membrane and the protection-wall vent hole is bent in shape.

It is possible according to the present invention to prevent the influence of high-pressure water etc. on the air-permeable waterproof membrane and ensure both of air permeability and waterproofness inside the housing.

DESCRIPTION OF EMBODIMENTS

An electronic control device according to one embodiment of the present invention includes: a housing having a plurality of housing members joined together to define therein an inner space; and a circuit board accommodated in the inner space of the housing and mounting thereon various electronic components.

Differently from the conventional art, the electronic control device of the present embodiment further includes not only an air-permeable waterproof membrane fixed in a vent hole of the housing but also a protection wall covering an outer opening of the housing vent hole, with a gap left between the protection wall and the outer opening of the housing vent hole, and having a protection-wall vent hole formed therein, characterized in that, for the purpose of preventing the air-permeable waterproof membrane from being affected by the entry of high-pressure water etc. through the protection-wall vent hole, the protection-wall vent hole is formed in the protection wall at a position apart from the housing vent hole so as to extend from the gap in a radial direction of the housing vent hole. Thus, there is defined a vent passage with a bent part between the air-permeable waterproof membrane and the protection-wall vent hole.

In the electronic control device where the housing vent hole and the protection wall are provided as mentioned above, the high-pressure water could enter through the protection-water vent hole from the outer peripheral side of the housing into the housing vent hole. If the high-pressure water (referred to as "entering water") flows from the protection-wall vent hole to the housing vent hole and collides with the air-permeable waterproof membrane in the housing vent hole (for example, the entering water straightly flows to and collides with the air-permeable waterproof membrane), the air-permeable waterproof membrane may be damaged (separated, broken) under the application of stress caused by the pressure of the entering water. As a method to prevent such damage, it is conceivable to reduce the sizes of the housing vent hole and the protection-wall vent hole. However, this conceivable method leads to deterioration of air permeability in the vent passage between the housing vent hole and the protection-wall vent hole and makes it difficult to ensure both of air permeability and waterproofness inside the housing. It is alternatively conceivable to form the vent passage in a complicated shape for prevention of the entering water. This alternative conceivable method however leads to size increase of the protection wall and cost increase of the electronic control device.

In the electronic control device of the present embodiment, by contrast, the bent part is formed in the vent passage between the air-permeable waterproof membrane and the protection-wall vent hole so that the vent passage performs an air-permeable function while allowing a wall surface of the vent passage to serve as a barrier against the entering water.

Figure 1:
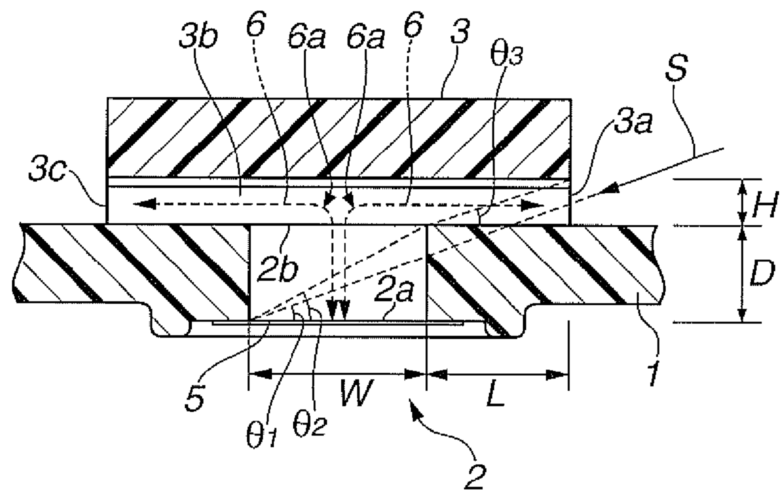
FIG. 1 is a schematic section view showing an example of an electronic control device according to one embodiment of the present invention (as taken along line X-X of FIG. 6).

One specific example of the electronic control device is shown in FIG. 1.

In the present example, the bent part 6*a* is formed in the center of the vent passage 6 between the inner opening 2*a* of the housing vent hole 2 and the protection-wall vent hole 3*a* (3*c*) so that the wall surface of the vent passage 6 (in the vicinity of the bent part 6*a*), such as an inner wall surface of the protection wall 3, an inner wall surface of the housing vent hole 2 (i.e. a wall surface of the housing vent hole 2 located closer to the outer opening 2*b* than the inner opening 2*a*) and an edge surface of the outer opening 2*b*, serves as the barrier as shown in FIG. 1. Even when the entering water S flows into the vent passage 6, it is likely that the entering water S will collide with the barrier. The pressure of the entering water S is reduced upon collision of the entering water S with the barrier. The air-permeable waterproof membrane 5, which is fixed in the inner opening 2*a* of the housing vent hole 2, is then protected from direct collision with or damage by the entering water S.

More specifically, in the case where the protection wall 3 is arranged over the outer opening 2*b* of the housing vent hole 2 with the gap 3*b* left between the outer opening 2*b* of the housing vent hole 2 and the protection wall 3, there is a possibility that the entering water S could flow into the housing vent hole 2 of the vent passage 6 from the outer peripheral side of the housing through the protection-wall vent hole 3*a* as shown in FIG. 1. In the present example, however, the bent part 6*a* is formed in the vent passage 6 such that the wall surface of the vent passage 6 easily serves as the barrier against the entering water S. The pressure of the entering water S can be reduced without the need to decrease the sizes of the housing vent hole 2 and the protection-wall vent hole 3*a* (3*c*) and without the need to increase the distance between the housing vent hole 2 and the protection-wall vent hole 3*a* (3*c*) to be larger than required. It is therefore possible in the present example to easily attain sufficient air permeability, without causing size increase of the housing, and ensure both of air permeability and waterproofness inside the housing.

As long as the bent part is formed in the vent passage, the electronic control device with the housing vent hole, the protection wall and the like can be in various configurations.

For example, it is feasible to modify the shapes of the housing vent hole, the gap and the protection-wall vent hole as appropriate as long as the bent part is formed in the vent passage as mentioned above. There are no particular limitations on the cross-sectional shapes of the housing vent hole and the gap, the shapes of the inner and outer openings of the housing vent hole and the shape of the protection-wall vent hole. The cross-sectional shapes of the housing vent hole and the gap, the shapes of the inner and outer openings of the housing vent hole and the shape of the protection-wall vent hole can be of any shapes such as perfect circular shape, oval shape, polygonal shape or the like.

The entering water could flow into the vent passage at various angles from the outer peripheral side of the housing through the protection-wall vent hole. The pressure of the entering water is relatively high when the entering water flows straightly into the vent passage. It is thus preferable to reduce the pressure of such high-pressure entering water by adjusting the shapes of the housing vent hole, the gap and the protection-wall vent hole in such a manner that it becomes easier for the entering water to collide with the wall surface of the vent passage.

One method for reducing the pressure of the entering water is to set the shape of the housing vent hole and the like in view of the angle of entry of the entering water.

As shown in FIG. 1 (schematic section view as taken along line X-X of FIG. 6), it is assumed, with respect to a projected line of the entering water S flowing in the vent passage through the protection-wall vent hole to the inside of the housing vent hole, that: $\theta_1$ is an angle between the projected line S and the inner opening 2*a* of the housing vent hole 2 of the housing member 1 (corresponding to the after-mentioned housing cover 13); W is an opening width of the inner opening 2*a* in a direction perpendicular to two vertical lines intersecting the inner opening 2*a* of the housing vent hole 2 at right angles from the projected line S; D is an axial length of the housing vent hole 2; and $\tan \theta_2$ is a ratio of D/W.

It is more likely that the straight entering water S will collide with the inner wall of the vent passage 6 as $\tan \theta_1$ becomes smaller than tan $\theta_2$. The housing vent hole 2 and the protection wall 3 are thus designed such that tan $\theta_1$ becomes relatively small (for example, to satisfy the relational expression of tan $\theta_2$>tan $\theta_1$ (referred to as "relational expression $\alpha$")).

By setting the shapes of the housing vent hole, the gap and the protection-wall vent hole in view of the angle of entry of the entering water as mentioned above, the wall surface of the vent passage, such as the inner wall surface of the protection wall 3, the inner wall surface of the housing vent hole 2 (i.e. the wall surface of the housing vent hole 2 located closer to the outer opening 2*b* than the inner opening 2*a*) and the edge surface of the outer opening 2*b*, easily serves as the barrier against the entering water S. The pressure of the entering water S is effectively reduced upon collision of the entering water S with the barrier. The air-permeable waterproof membrane 5, which is fixed in the inner opening 2*a* of the housing vent hole 2, is then protected from direct collision with the entering water S.

The range of the angle $\theta_1$ of the entering water S is determined depending on the fixed position of the electronic control device on the vehicle body, the shape of the housing (the shapes of the housing members 1), the shape of the protection wall 3 (the shapes of the protection-wall vent hole 3*a* and the gap 3*b*), the position of the housing vent hole 2 and the like. Even when the entering water S flows to the housing vent hole 2 through the protection-wall vent hole 3*a* within the determined angle range, it suffices to design the shapes of the housing vent hole 2 and the protection wall 3 such that tan $\theta_1$ becomes relatively small (e.g. to satisfy the relational expression $\alpha$). The air-permeable waterproof membrane 5 can be protected from direct collision with the entering water S without the need to decrease the sizes of the housing vent hole 2 and the protection-wall vent hole 3 to be smaller than required and without the need to increase the distance between the housing vent hole 2 and the protection-wall vent hole 3 to be larger than required.

In the case where the cross-sectional shape of the housing vent hole is e.g. oval, the opening width of the housing vent hole differs depending on the direction of cross section of the housing vent hole. In such a case, it is easier to set tan $\theta_1$ to a relatively small value (e.g. satisfy the relational expression $\alpha$) by assuming the smallest opening width of the housing vent hole as W (for example, in the case where the cross-sectional shape of the housing vent hole is oval, assuming the shorter diameter of the housing vent hole as W) in the relational expression $\alpha$. It is easier to set tan $\theta_1$ to a relatively small value even in the case where a protrusion 2*c* is formed at an edge of the outer opening 2*b* (or inner opening 2*a*) of the housing vent hole 2 as shown in FIG. 2 (schematic section view as taken along line X-X of FIG. 6).

As to the protection wall, it is feasible to set the distance between the housing vent hole and the protection-wall vent hole and the shape of the protection-wall vent hole as appropriate. In the case where a protrusion is formed in the protection wall and, more specifically, a protection 3*d* is formed to protrude toward the housing vent hole 2 from a position facing the housing vent hole 2 on the inner wall surface of the protection wall 3 as shown in FIG. 3 (schematic section view as taken along line X-X of FIG. 6), the protrusion 3*d* also serves as the barrier against the entering water S so as to more effectively prevent direct collision of the entering water S with the housing vent hole 2.

It is further assumed as shown in FIG. 1 that: L is a distance between the housing vent hole 2 and the protection-wall vent hole 3*a*; H is an opening width (height) of the protection-wall vent hole 3*a*; and tan $\theta_3$ is a ratio of H/L. When the housing vent hole 2 and the protection wall 3 are designed such that tan $\theta_3$ becomes relatively small (for example, to satisfy the relational expression of tan $\theta_1$>tan $\theta_3$ (referred to as "relational expression $\beta$")), the inner wall surface of the protection wall 3 and the edge surface of the outer opening 2*b* serve as the barrier against the entering water S to reduce the pressure of the entering water S and more effectively protect the air-permeable waterproof membrane 5 from direct collision with the entering water S.

Figure 2:
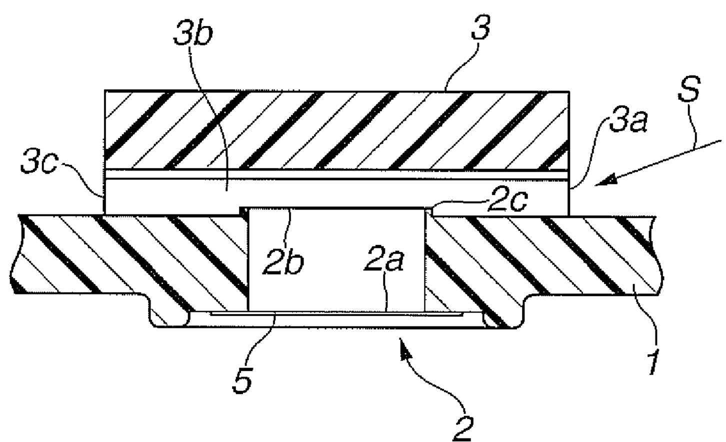
FIG. 2 is a schematic section view showing another example of the electronic control device according to the one embodiment of the present invention (as taken along line X-X of FIG. 6).
Figure 3:
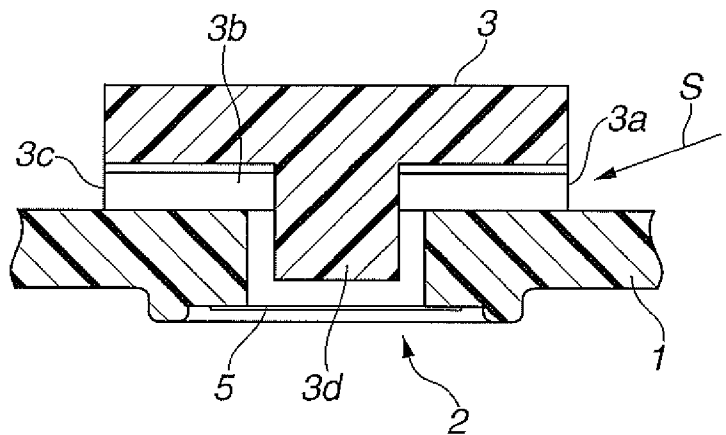
FIG. 3 is a schematic section view showing still another example of the electronic control device according to the one embodiment of the present invention (as taken along line X-X of FIG. 6).

The protection wall 3 may have a plurality of vent holes 3*a* and 3*c*, rather than a single vent hole 3*a*, as shown in FIGS. 1 to 3. The formation of such a plurality of vent holes 3*a* and 3*c* makes it easier to reduce the internal pressure of the housing vent hole 2 and the protection wall 3 and improve the air permeability in the vent passage with the bent part.

Further, each of edges of the housing vent hole 2, the inner wall surface of the protection wall 3 and the protection-wall vent hole 3*a*, 3*c* may be appropriately chamfered into a tapered shape. This makes it easier that, even when the entering water S (whose pressure has been reduced by the barrier) accumulates in the housing vent hole 2 etc., the accumulating water can be discharged from the housing vent hole 2 to the outside. In the case where the direction of cross section of the housing vent hole 2 forms a predetermined angle relative to the horizontal direction (in accordance with the fixed position of the electronic control device), the discharge of the accumulating water can be promoted so as not to fill up the housing vent hole 2 even when the entering water S accumulates in the housing vent hole 2.

There are no particular limitations on the materials of the housing members and the protection wall as long as the bent part is formed in the vent passage. Examples of the materials of the housing members and the protection wall are those capable of defining the housing vent hole and the protection-wall vent hole, respectively, so as to satisfy the relational expression $\alpha$ or the relational expression $\beta$ as mentioned above. The housing members and the protection wall can be integrally formed into a desired shape by molding of a resin material or by molding or casting (die casting) of a metal material (such as aluminum or iron). In order to enhance heat radiation from surfaces of the housing members, thin-film insulating treatment (such as surface treatment e.g. alumetization, coating treatment e.g. cathodic electrodeposition or the like) may be performed on the surfaces of the housing members.

Application Example

By way of example, the application of the electronic control device of the present embodiment as an engine control unit of a vehicle will be described below with reference to the drawings.

Figure 4:
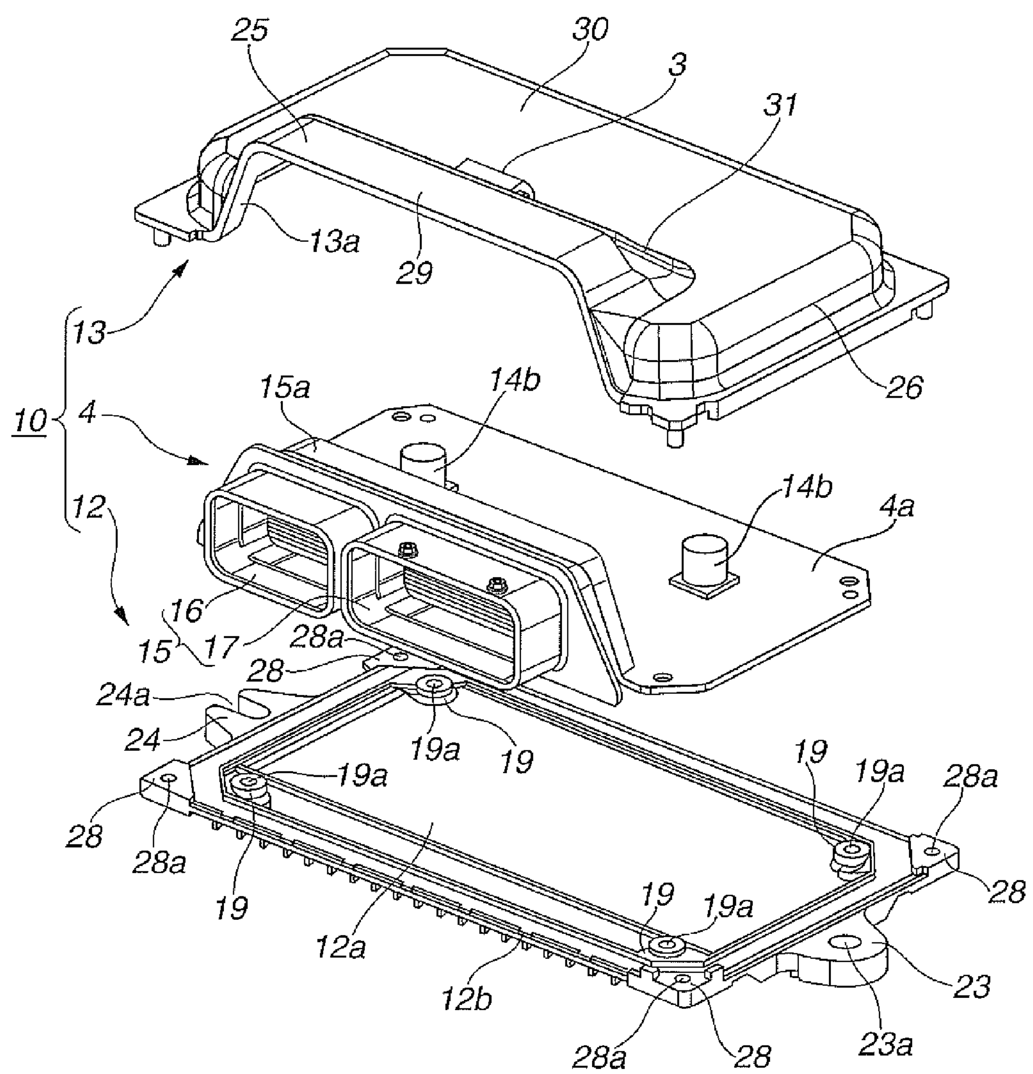
FIG. 4 is an exploded perspective view of the electronic control device according to the one embodiment of the present invention (as viewed from the upper side).
Figure 5:
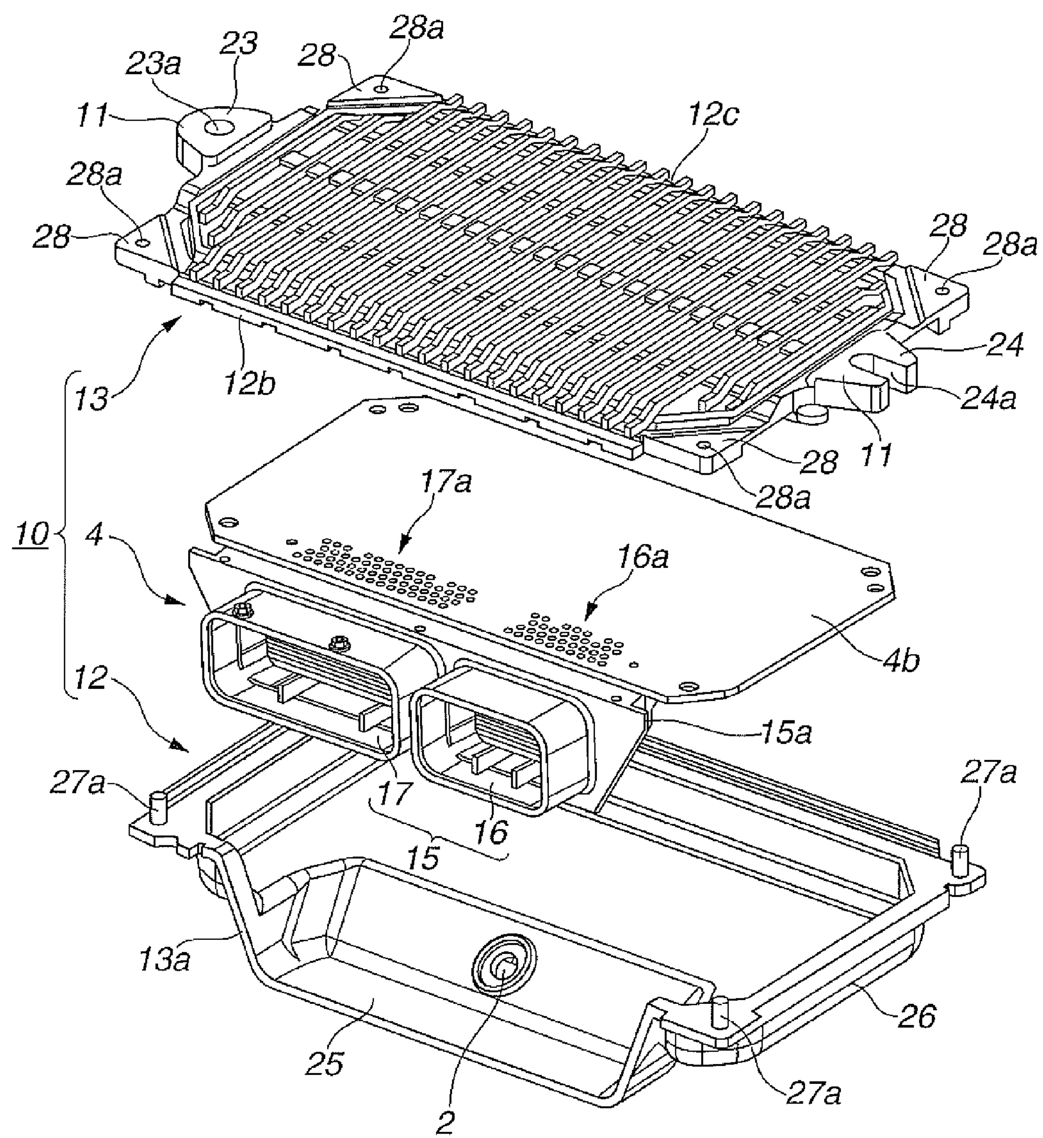
FIG. 5 is an exploded perspective view of the electronic control device according to the one embodiment of the present invention (as viewed from the lower side).

First, the basic structure of the electronic control device 10, in which the housing is provided with a plurality of housing members (housing case 12 and housing cover 13) to accommodate therein the circuit board 4, will be explained with reference to FIGS. 4 to 6. In the following explanation, the upper-lower direction of FIG. 4, i.e., the thickness direction of the circuit board 4 is sometimes referred to as the upper-lower direction of the electronic control device 10 for the sake of convenience. This direction does not, however, necessarily correspond to a vertical direction of the vehicle under a state that the electronic control device has been mounted on the vehicle. For example, when the electronic control device 10 is mounted in vertical orientation on the vehicle, the upper-lower direction of the electronic control device 10 in FIG. 4 is in agreement with the front-rear direction of the vehicle.

In the electronic control device 10, the housing has a substantially plate-shaped housing case 12 fixed to the vehicle body and a substantially box-shape housing cover 13 liquid-tightly joined to the housing case 12 (via a seal member) to define therein a protection space. The circuit board 4 on which various electronic components are mounted is accommodated in the protection space of the housing. Although not specifically shown in the drawings, the electronic control device 10 is placed in an engine room etc. of the vehicle. The electronic control device 10 is fixed to the vehicle body at bottom surfaces of the after-mentioned brackets 23 and 24 as fixing surfaces of the housing case 12. In the present example, the fixing surfaces for fixing to the vehicle body are made parallel to the bottom of the housing case 12. However, these fixing surfaces may alternatively be inclined relative to the bottom of the housing case 12 depending on the shapes of the fixing parts (brackets 23 and 24).

The respective structural parts of the electronic control device will be next explained below.

The circuit board 4 is configured as a so-called printed circuit board having a wiring circuit pattern formed on both sides and inside of e.g. a glass-epoxy resin substrate plate. Non-heat-generating electronic components including electronic components that are relatively unlikely to generate heat, such as capacitors and coils, and electronic components that do not specifically require heat radiating means, such as heat sinks, are mounted on an upper surface 4*a* of the circuit board 4 (adjacent to the housing cover 13). Heat-generating electronic components that are relatively likely to generate heat, such as arithmetic processing units, transistors and ICs, are mounted on a lower surface 4*b* of the circuit board 4 (adjacent to the housing case 12). The heat-generating electronic components and the non-heat-generating electronic components are electrically connected to the wiring circuit pattern by soldering etc.

A connector 15 with two first and second connection ports 16 and 17 is attached to a peripheral edge portion of the circuit board 4 for connection to external connectors. In this connector 15, the connection ports 16 and 17 are divided from each other according to their respective connection points but are integrated together by an attachment base portion 15*a*. The connector 15 is fixed to the circuit board 14 via the attachment base portion 15*a* (with e.g. a plurality of screws). Herein, there is a window space 13*a* defined between the housing case 12 and the housing cover 13. The connector 15 in which the connection ports 16 and 17 are integrated together by the attachment base portion 15*a* is arranged such that the connection ports 16 and 17 are exposed to the outside through the window space 13*a* and are connected to the vehicle-side external connectors.

A plurality of male terminals 16*a* and 17*a* are provided on the connector 15 and electrically connected to the wiring circuit pattern of the circuit board 4. By engagement of these male terminals 16*a* and 17*a* with female terminals on the external connectors, the circuit board 4 makes electrical connections to given devices such as sensor and pump to which the external connectors (female terminals) are attached.

The housing case 12 is integrally formed of a highly heat conductive metal material such as aluminum and has a substantially plate shape and, more specifically, a shallow box shape with its outer peripheral edge rising slightly. In the present example, the housing case 12 includes a substantially rectangular bottom wall 12*a* and a peripheral wall 12*b* extending upward from an outer peripheral edge (four sides) of the bottom wall 12*a* and having its upper end side entirely open. For fixing of the housing cover 13, cover fixing portions 28 are provided on four corners of the peripheral wall 12*b*. Through holes 28*a* are made vertically through the respective cover fixing portions 28.

For fixing of the circuit board 4, board fixing portions 19 are provided on peripheral edge regions of the bottom wall 12*a* of the housing case 12 at positions inside the peripheral wall. Each of the board fixing portions 19 has an upper end formed with a flat support surface to support thereon the circuit board 4. Female thread holes 19*a* are made in the respective support surfaces of the board fixing portions 19. The circuit board 4 is fixed in the housing case 12 by supporting the circuit board 4 on the board fixing portions 19 and tightening screws in the female thread holes 19*a*.

For fixing of the electronic control device 10 to the vehicle body (not shown), a pair of brackets 23 and 24 are formed integrally on the outer periphery of the peripheral wall 12*b* of the housing case 12. A through hole 23*a* is made vertically through the bracket 23, whereas an open cut groove 24 *a* is made vertically through the bracket 24. The electronic control device 10 is fixed to the vehicle body by inserting bolts etc. into the through hole 23*a* and the cut groove 24*a*. Further, a plurality of strip-shaped heat radiation fins 12*c* are provided in parallel to one another at predetermined intervals on the outer surface of the bottom wall 12*a* of the housing case 12 as shown in FIG. 5.

The housing cover 13 is integrally formed of a predetermined synthetic resin material lower in weight and cost than the metal material and has a substantially box shape. In the present example, the housing cover 13 includes a top wall 25 covering the upper sides of the circuit board 4 and the connector 15 and a peripheral wall 26 surrounding three sides, except the window space 13*a*, of the outer peripheral edge of the top wall 25. Positioning protrusions 27*a* are formed on the peripheral wall 26 at positions facing the cover fixing portions 28 of the housing case 12 for insertion through the through holes 28*a* of the cover fixing portions 28. The housing cover 13 is fixed to the housing case 12 by supporting the housing cover on the cover fixing portions 28 and inserting the positioning protrusions 27 through the respective through holes 28*a*.

To ensure watertightness, the joint part between the upper peripheral edge of the housing case 12 and the lower peripheral edge of the housing cover 13, the joint part between the upper peripheral edge of the housing case 12 and the lower peripheral edge of the connector 15 and the joint part between the outer periphery of the connector 15 and the inner peripheral edge of the window space 13*a* are liquid-tightly sealed by a sealing agent. Although not specifically shown in the drawings, it is feasible to seal the mating surfaces of the respective joint part by forming a seal groove in one of the mating surfaces, forming a protrusion on the other of the mating surfaces, and then, engaging the protrusion in the seal groove while filling the sealing agent in clearance between the sealing groove and the protrusion so that the joint part can secure the sufficient length of the sealing agent filled in the clearance between the sealing groove and the protrusion, called "seal length", and thereby attain desired seal performance. There is no particular limitation on the sealing agent as long as the sealing agent has fluidity. As the sealing agent, there can be used an epoxy sealant, a silicon sealant, an acrylic sealant or the like depending on the specifications and requirements of the electronic control device 10.

As mentioned above, the connector 15 is attached to one end of the circuit board 4 with its connection ports opening at the lateral side of the electronic control device 10. For this reason, the housing cover 13 is formed into a stepped shape according to the dimensions (heights) of the circuit board 4 and the connector 15 in the thickness direction of the circuit board. More specifically, the top wall 25 of the housing cover 13, which faces the housing case 12 via the circuit board 4 and the connector 15, includes upper and lower step portions 29 and 30 extending in parallel to the fixing surfaces 11 of the housing case 12. The upper step portion 29 is adapted to cover the upper side of the connector 15, whereas the lower step portion 30 is adapted to cover the upper side of the circuit board 4. Thus, the dimension of the upper step portion 29 in the thickness direction of the circuit board is set larger than that of the lower step portion 30. The top wall 25 of the housing cover 13 further includes an inclined wall portion 31 extending smoothly between the different-height upper and lower step portions 29 and 30. The inclined wall portion 31 is inclined in a flat manner at a predetermined inclination angle of e.g. about 45 degrees relative to the bottom wall 12*a* of the housing case 12 and is consequently inclined at the same inclination angle as relative to the upper step portion 29 and the lower step portion 30.

For the purpose of constituting a so-called breathing filter, the housing vent hole 2 is formed through the inclined wall portion 31 in the thickness direction; and the protection wall 3 is arranged on the inclined wall portion 31 so as to protect the housing vent hole 2. The air-permeable waterproof membrane, which is formed of an air-permeable waterproof material such as Gore-Tex (trademark) in a thin-film shape, is fixed in the housing vent hole 2. The protection wall 3 has the function of, at the time of e.g. vehicle washing, preventing high-temperature high-pressure water from being directly blown onto the air-permeable waterproof membrane.

As shown in FIGS. 1 to 3, the protection wall 3 is arranged to cover the outer opening 2*b* of the housing vent hole 2, with the predetermined gap 3*b* left between the outer opening 2*b* and the protection wall 3, so as to allow permeation of air into the housing vent hole 2. The protection-wall vent hole 3*a*, 3*c* is formed in the protection wall 3 so as to communication with the gap 3*b*. The inner wall surface of the protection wall 3, which defines the gap 3*b*, is set larger in area and dimension than the housing vent hole 2 in order to effectively protect the air-permeable waterproof membrane 5 fixed in the housing vent hole 2 from the entering water S during vehicle washing etc. The vent passage is defined continuously by the gap 3*b* and the protection-wall vent hole 3*a*, 3*c* of the protection wall 3 for permeation of air into the housing vent hole 2. This passage also functions as a discharge passage to, when the entering water S accumulates in the housing vent hole 2 as the accumulating water S1, discharge the accumulating water S1 to the outside as will be explained below.

Figure 6:
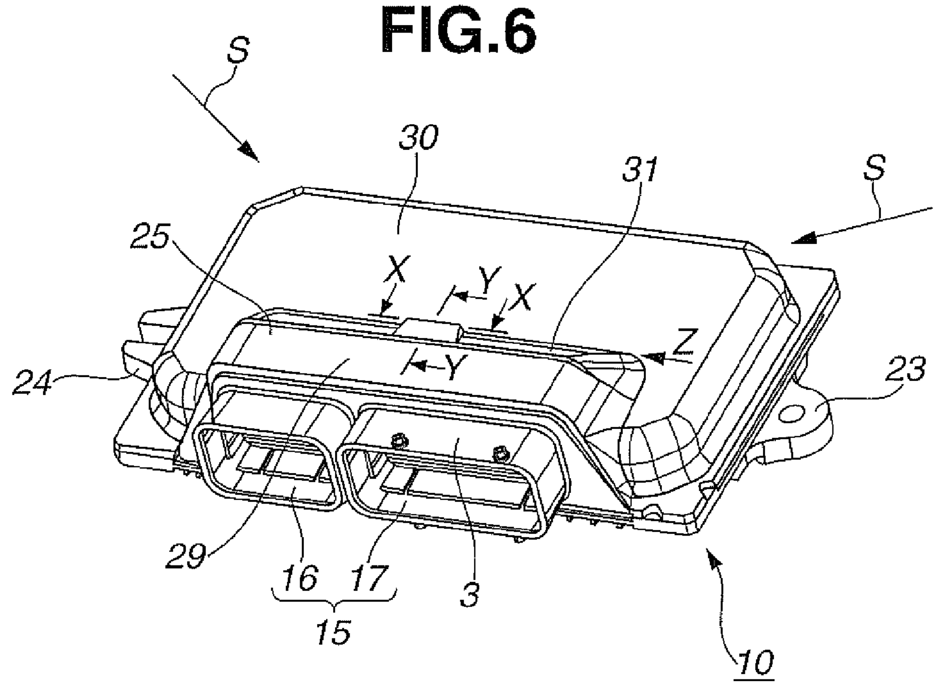
FIG. 6 is a schematic view of the electronic control device according to the one embodiment of the present invention (as seen in an assembled state).

In many cases, the electronic control device 10 is mounted on the vehicle in vertical orientation where the fixing surfaces 11 are aligned along a substantially vertical direction 49 as shown in FIG. 7(B) (schematic section view as taken along line Y-Y of FIG. 6) or in horizontal orientation where the fixing surfaces 11 are aligned along a substantially horizontal direction 48 as shown in FIG. 8(B) (schematic section view as taken along line Y-Y of FIG. 6).

The present inventors have focused on this fact and come up with the idea to form the housing vent hole 2 in the inclined wall portion 31 of the outer wall of the housing, which is inclined relative to the flat vehicle-body fixing surfaces 11 of the housing, such that the air-permeable waterproof membrane 5 is inclined at a predetermined angle relative to the flat vehicle-body fixing surface 11 of the housing.

Figure 7:
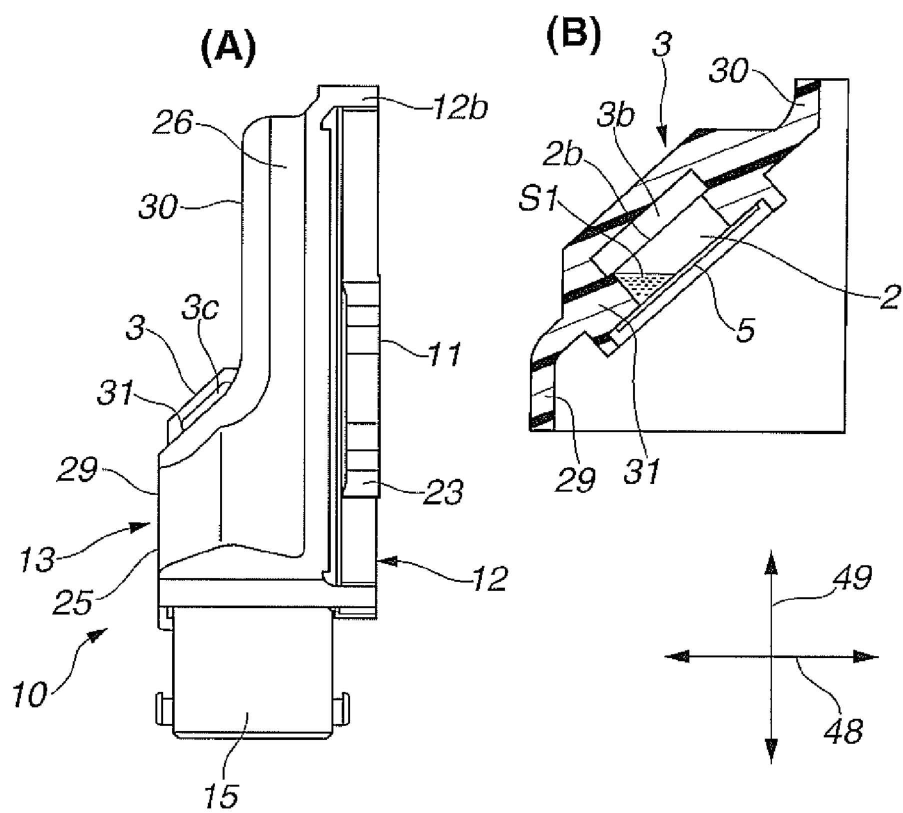
FIG. 7 is a schematic section view showing an example of application of the electronic control device according to the one embodiment of the present invention (as taken along line Y-Y of FIG. 6).
Figure 8:
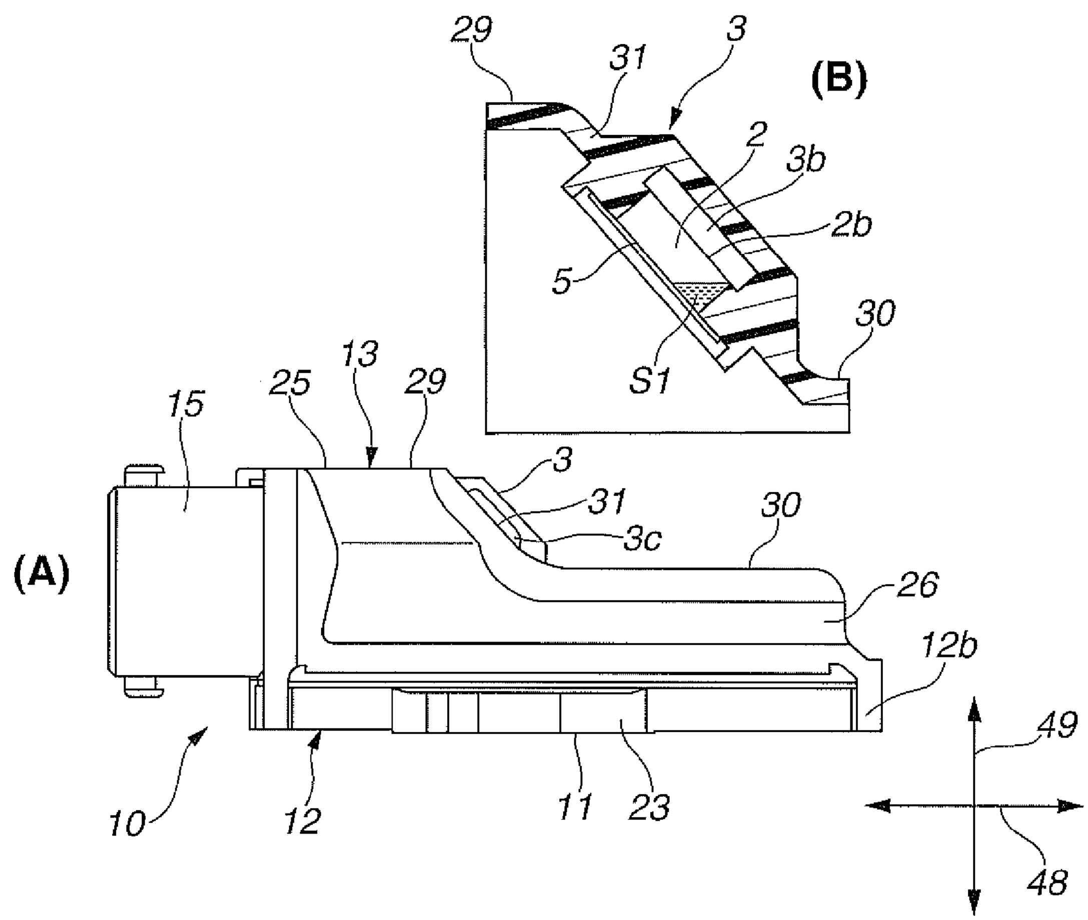
FIG. 8 is a schematic section view showing another example of application of the electronic control device according to the one embodiment of the present invention (as taken along line Y-Y of FIG. 6).

Accordingly, the air-permeable waterproof membrane 5 is inclined relative to the horizontal plane (i.e. the left/right direction of FIGS. 7 and 8) in either the vertical orientation or the horizontal orientation as shown in FIGS. 7 and 8. Even if the entering water S accumulates in the housing vent hole 2 as the accumulating water S1, a part (water surface) of the accumulating water S1 reaches the upper end of the inclined housing vent hole 2 and gets discharged to the outside through the gap 3*b* at the time before the filling-up of the housing vent hole (i.e. at the time the accumulating water S1 accumulates to a certain level in the housing vent hole). The accumulating water S1 can be prevented from accumulating more than the certain level. It is thus possible to prevent clogging of the air-permeable waterproof membrane 5 by the entering water S and ensure the desired air permeability and waterproofness of the air-permeable waterproof membrane 5 for improvement of reliability and durability even with a simple configuration.

For example, the inclination angle of the air-permeable waterproof membrane 5 relative to the fixing surfaces 11 can be set to 45 degrees or a predetermined range around 45 degrees and, more specifically, about 30 to 60 degrees, so as to secure sufficient inclination of the air-permeable waterproof membrane 5 at about 45 degrees relative to the horizontal plane in either the vertical orientation or the horizontal orientation and ensure the air permeability and waterproofness of the air-permeable waterproof membrane 5 regardless of the mounted orientation of the electronic control device.

In order to more effectively prevent clogging of the air-permeable waterproof membrane 5, it is a precondition to set the size and shape of the housing vent hole 2 and the like in such a manner as to satisfy the relational expression α or the relational expression β. For example, the diameter (radial dimension) of the housing vent hole 2 can be set sufficiently larger (e.g. twice or more larger) than the depth (axial dimension) of the housing vent hole 2.

Figure 9:
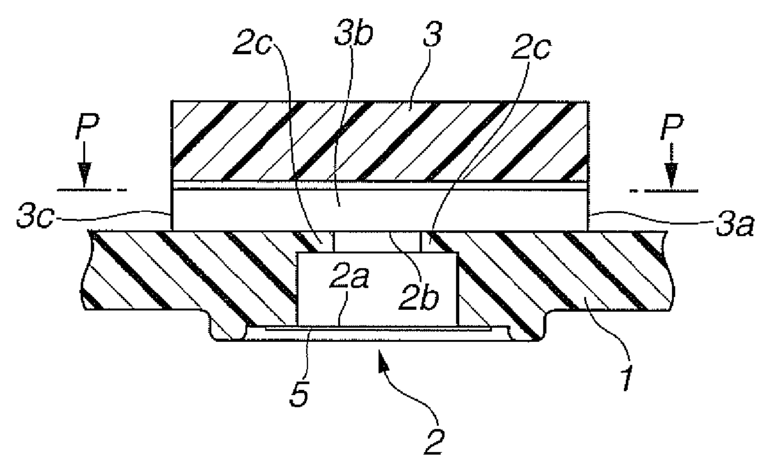
FIG. 9 is a schematic section view showing an example of a housing vent hole in the electronic control device according to the one embodiment of the present invention (as taken along line X-X of FIG. 6).
Figure 10:
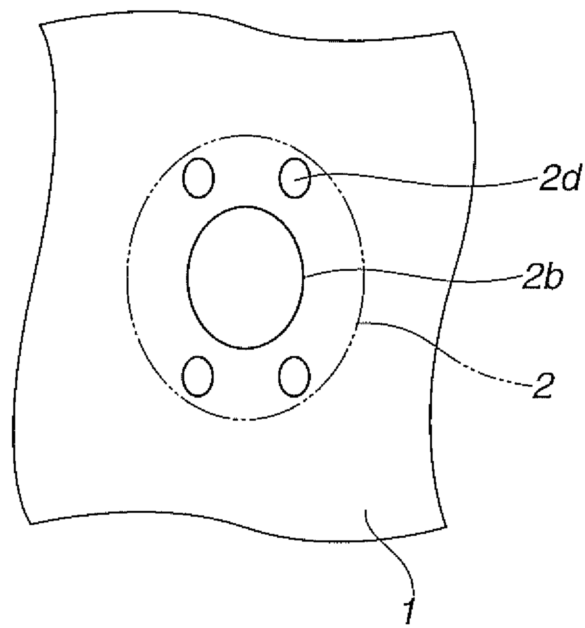
FIG. 10 is a schematic view showing the example of the housing vent hole in the electronic control device according to the one embodiment of the present invention (as viewed from line P-P of FIG. 9).

Furthermore, the radial dimension of the outer opening 2*b* can be set smaller than that of the inner opening 2*a* by forming a protrusion in the housing vent hole 2, e.g., by forming a protrusion 2*c* in the housing vent hole 2 at a position adjacent to the outer opening 2*b* as shown in FIG. 9 for more effective prevention of the flow of the entering water S into the housing vent hole 2. As shown in FIG. 10, through holes 2*d* may be made through the protrusion 2*c* so as to communicate with the housing vent hole 2 (e.g. extend through the protrusion 2*c* in the same direction as the housing vent hole 2 and then communicate with the housing vent hole 2). By the formation of such through holes 2*d*, it is made easier to discharge the accumulating water (accumulating water S1 in FIGS. 7 and 8) from the housing vent hole 2. The through holes 2*d* are preferably formed at positions apart from the protection-wall vent hole 3*a*, 3*c* although it is feasible to form the through holes 2*d* in the protrusion 2*c* as appropriate.

In the protection wall 3, the opening of the protection-wall vent hole 3*a*, 3*c* can be of any shape such as trapezoid, perfect circle shape, oval shape or semicircle shape.

Figure 11:
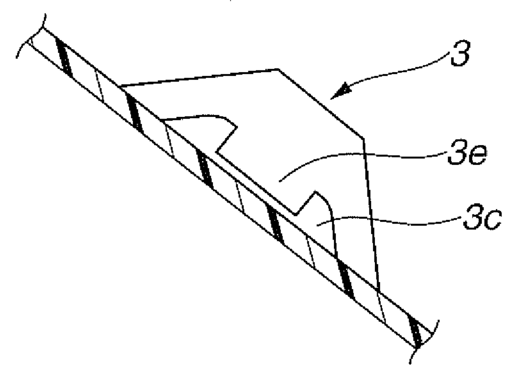
FIG. 11 is a schematic section view showing an example of a protection wall in the electronic control device according to the one embodiment of the present invention (as viewed in arrow direction Z of FIG. 6).
Figure 12:
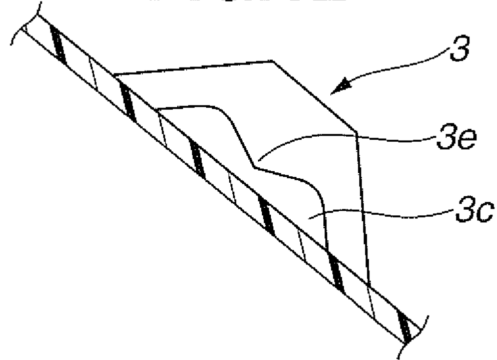
FIG. 12 is a schematic section view showing another example of the protection wall in the electronic control device according to the one embodiment of the present invention (as viewed in arrow direction Z of FIG. 6).

A protrusion 3*e* can be formed on the protection wall 3 so as to protrude toward the inside of the protection-wall vent hole 3*c* as shown in FIGS. 11 and 12 (schematic section views as viewed in arrow direction Z of FIG. 6) for more effective prevention of the entering water S.

Figure 13:
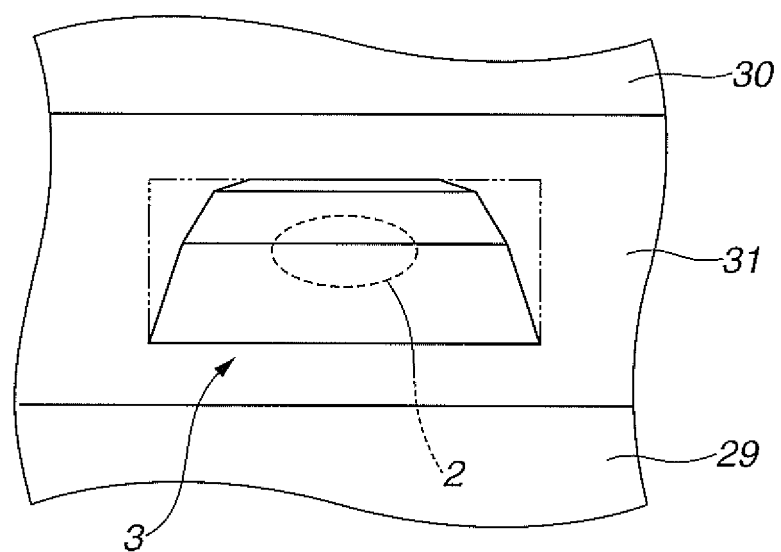
FIG. 13 is a schematic view showing still another example of the protection wall in the electronic control device according to the one embodiment of the present invention (as viewed from the upper side).

In the case where the electronic control device has any part that serves as the barrier against the entering water S, for example, in the case where the entering water S collides with the corners of the housing cover 13 as shown in FIG. 6, the entering water S does not reach the vicinity of the protection wall 3 from the collision direction. The outer wall shape of the protection wall 3 can be thus decreased as shown in FIG. 13 (to a trapezoid shape by omission of areas indicated by double-dashed chain lines in FIG. 13) so as to decrease the distance between the housing vent hole 2 and the protection-wall vent hole 3*a*, 3*c* for reduction of the internal pressure of the housing vent hole 2 and the protection wall 3 and to offset the position of the housing vent hole 2 toward the connector 15 for improvement of the air permeability in the vent passage.

In the case where the housing vent hole 2 and the protection wall 3 are provided on the upper step portion 29 or the peripheral wall 26 of the housing cover 13, the protection wall 3 partially protrudes to the upper side or lateral side of the electronic control device 10. This leads to increase of the height or width dimension of the electronic control device as a whole or deterioration of the mountability of the electronic control device on the vehicle due to interference with other structural parts in the engine room.

In the present example, however, the protection wall 3 is provided on the inclined wall portion 31 so as to protrude into a space diagonally adjacent to the inclined wall portion 31 and exert no influence on the dimension of the electronic control device as a whole. It is thus possible to prevent upsizing of the electronic control device caused by the arrangement of the protection wall 3 and improve the mountability of the electronic control device on the vehicle.

As the connector 15 of predetermined thickness is exposed at the lateral side of the electronic control device 10, the housing cover 13 is formed in a stepped shape according to difference between the thickness of the connector 15 and the thickness of the circuit board 4. More specifically, the upper and lower step portions 29 and 30 of different heights are formed on the top wall 25 of the housing cover 13 in parallel to the fixing surfaces 11 of the housing case 12. The dimension of the upper step portion 29 in the thickness direction of the circuit board is set larger than that of the lower step portion 30 so as to cover the relatively thick connector 15 by the upper step portion 29 and cover the relatively thin circuit board 4 by the lower step portion 30. Then, the portion of the top wall 25 connecting these different-thickness upper and lower step portions 29 and 30 is adapted as the inclined wall portion 31. The housing vent hole 21 is formed in this inclined wall portion 31. There is no need to separately form the inclined wall portion 31. Thus, it is very easy to apply the present invention. Further, the inclined wall portion 31 is inclined relative to the upper and lower step portions 29 and 30. As compared to the case where the upper and lower step portions 29 and 30 are connected by a perpendicular wall portion, the inclination/curvature angles of the connection parts (edge parts) between the upper step portion 29 and the inclined wall portion 31 and between the lower step portion 30 and the inclined wall portion 31 becomes gentle so as to relieve concentration of stress on these connection parts.

Although the present invention has been described in detail with reference to the above specific embodiments, the present invention is not limited to those specific embodiments. It is apparent to those skilled in the art that various changes and modifications can be made without departing from the technical idea of the present invention and fall within the scope of the present invention.

The invention claimed is:

1. An electronic control device, comprising:

a housing having a plurality of housing members joined together to define therein an inner space;

a circuit board accommodated in the inner space of the housing and mounting thereon various electronic components; and a connector attached to one end of the circuit board, wherein at least one of the housing members includes an upper step portion covering the connector, a lower step portion covering the circuit board and an inclined wall portion connecting the upper and lower step portions, the inclined wall portion having a housing vent hole formed therethrough in a thickness direction of the inclined wall portion, the housing vent hole being inclined relative to the upper and lower step portions and the circuit board;

wherein the electronic control device comprises a protection wall arranged on the inclined wall portion and having a wall surface covering an outer opening of the housing vent hole, with a gap left between the wall surface of the protection wall and the outer opening of the housing vent hole and communicating with the housing vent hole, the protection wall having a closed connection at upper and lower sides thereof to the inclined wall portion and defining protection-wall vent holes at both sides in a horizontal direction thereof, each of the protection-wall vent holes extending along the wall surface of the protection wall from the gap to the outside in a radial direction of the housing vent hole and being open to the outside;

wherein the electronic control device further comprises an air-permeable waterproof membrane fixed to an inner opening of the housing vent hole, whereby there is a vent passage defined between the air-permeable waterproof membrane and each of the protection-wall vent holes such that the vent passage has a bent part from the housing vent hole to the gap so as to be in communication with the protection-wall vent holes; and wherein a relational expression of $\tan \theta_2 > \tan \theta_1$ is satisfied where $\theta_1$ is an angle between an entering water S flowing in the vent passage through the protection-wall vent hole to the inside of the housing vent hole and the inner opening of the housing vent hole; W is an opening width of the inner opening in a direction perpendicular to two vertical lines intersecting the inner opening of the housing vent hole at right angles from the entering water S; D is an axial length of the housing vent hole; and $\tan \theta_2$ is a ratio of D/W.

2. The electronic control device according to claim 1, wherein the housing has a fixing surface for fixing on a vehicle body;

wherein the at least one of the housing members has the inclined wall portion inclined relative to the fixing surface; and wherein the housing vent hole is formed in the inclined wall portion of the at least one of the housing members such that the air-permeable waterproof membrane is inclined at a predetermined angle relative to the fixing surface.

3. The electronic control device according to claim 1, wherein the protection wall is formed integral with the housing member.

4. An electronic control device, comprising:

a housing having a plurality of housing members joined together to define therein an inner space; and a circuit board accommodated in the inner space of the housing and mounting thereon various electronic components; and a connector attached to one end of the circuit board;

wherein at least one of the housing members includes an upper step portion covering the connector, a lower step portion covering the circuit board and an inclined wall portion connecting the upper and lower step portions, the inclined wall portion having a housing vent hole formed therethrough in a thickness direction of the inclined wall portion, the housing vent hole being inclined relative to the upper and lower step portions and the circuit board;

wherein the electronic control device comprises a protection wall arranged on the inclined wall portion and having a wall surface covering an outer opening of the housing vent hole, with a gap left between the wall surface of the protection wall and the outer opening of the housing vent hole and communicating with the housing vent hole, the protection wall having a closed connection at upper and lower sides thereof to the inclined wall portion and defining protection-wall vent holes at both sides in a horizontal direction thereof, each of the protection-wall vent holes extending along the wall surface of the protection wall from the gap to the outside in a radial direction of the housing vent hole and being open to the outside;

wherein the electronic control device further comprises an air-permeable waterproof membrane fixed to an inner opening of the housing vent hole, whereby there is a vent passage defined between the air-permeable waterproof membrane and each of the protection-wall vent holes such that the vent passage has a bent part from the housing vent hole to the gap so as to be in communication with the protection-wall holes;

wherein the housing has a fixing surface for fixing on a vehicle body;

wherein the inclined wall portion is inclined relative to the fixing surface;

wherein the air-permeable waterproof membrane is inclined at a predetermined angle relative to the fixing surface; and wherein there is a predetermined angle formed between a direction of cross section of the housing vent hole and the horizontal direction.

5. An electronic control device, comprising:

a housing having a plurality of housing members joined together to define therein an inner space;

a circuit board accommodated in the inner space of the housing and mounting thereon various electronic components; and a connector attached to one end of the circuit board, wherein at least one of the housing members includes an upper step portion covering the connector, a lower step portion covering the circuit board and an inclined wall portion connecting the upper and lower step portions, the inclined wall portion having a housing vent hole formed therethrough in a thickness direction of the inclined wall portion, the housing vent hole being inclined relative to the upper and lower step portions and the circuit board;

wherein the electronic control device comprises a protection wall arranged on the inclined wall portion and having a wall surface covering an outer opening of the housing vent hole, with a gap left between the wall surface of the protection wall and the outer opening of the housing vent hole and communicating with the housing vent hole, the protection wall having a closed connection at upper and lower sides thereof to the inclined wall portion and defining protection-wall vent holes at both sides in a horizontal direction thereof, each of the protection-wall vent holes extending along the wall surface of the protection wall from the gap to the outside in a radial direction of the housing vent hole and being open to the outside;

wherein the electronic control device further comprises an air-permeable waterproof membrane fixed to an inner opening of the housing vent hole, whereby there is a vent passage defined between the air-permeable waterproof membrane and each of the protection-wall vent holes such that the vent passage has a bent part from the housing vent hole to the gap so as to be in communication with the protection-wall vent holes; and wherein a protrusion is formed in the housing vent hole.

* * * * *